United States Patent [19]
Goldberg

[11] Patent Number: 5,150,081
[45] Date of Patent: Sep. 22, 1992

[54] INTEGRATED CRYSTAL OSCILLATOR WITH CIRCUIT FOR LIMITING CRYSTAL POWER DISSIPATION

[75] Inventor: Jules Goldberg, Santa Clara, Calif.

[73] Assignee: Adaptec, Inc., Milpitas, Calif.

[21] Appl. No.: 662,530

[22] Filed: Feb. 28, 1991

[51] Int. Cl.$^5$ .......................... H03B 5/36; H03L 5/02
[52] U.S. Cl. .............................. 331/109; 331/116 FE;
331/160; 331/183
[58] Field of Search ................... 331/109, 183, 116 R,
331/116 FE, 158, 160

[56] References Cited

U.S. PATENT DOCUMENTS 3,982,210  9/1976  Gehrke ................................ 331/109
4,651,113  3/1987  Fujita ................................. 331/109

OTHER PUBLICATIONS

Eric A. Vittoz et al., "High-Performance Crystal Oscillator Circuits: Theory and Application", *IEEE Journal of Solid-State Circuits*, vol. 23, No. 3, pp. 774-782, Jun. 1988.
Eric A. Vittoz, "Quartz Oscillators for Watches", *Proceedings, International Congress of Chronometry*, pp. 131-140 (1979).

Primary Examiner—Siegfried H. Grimm
Attorney, Agent, or Firm—Skjerven, Morrill, MacPherson, Franklin & Friel

[57] ABSTRACT

On an integrated circuit, a power limiting circuit is added to a crystal oscillator for limiting power dissipation in the crystal to a prescribed safe power dissipation range. The power limiting circuit includes a Pierce design crystal-controlled oscillator coupled to a self-stabilizing circuit. The self-stabilizing circuit detects the oscillation amplitudes of the crystal controlled oscillator. The self-stabilizing circuit prevents the oscillations from exceeding a predetermined maximum power dissipation level for the crystal. The self-stabilizing circuit includes a means for detecting oscillation amplitudes and means for limiting the gain of the crystal controlled oscillator circuit. Therefore, independent of manufacturing tolerances from integrated circuit to integrated circuit, the self-stabilizing circuit assures that the maximum power dissipation level of the crystal is not exceeded.

17 Claims, 4 Drawing Sheets

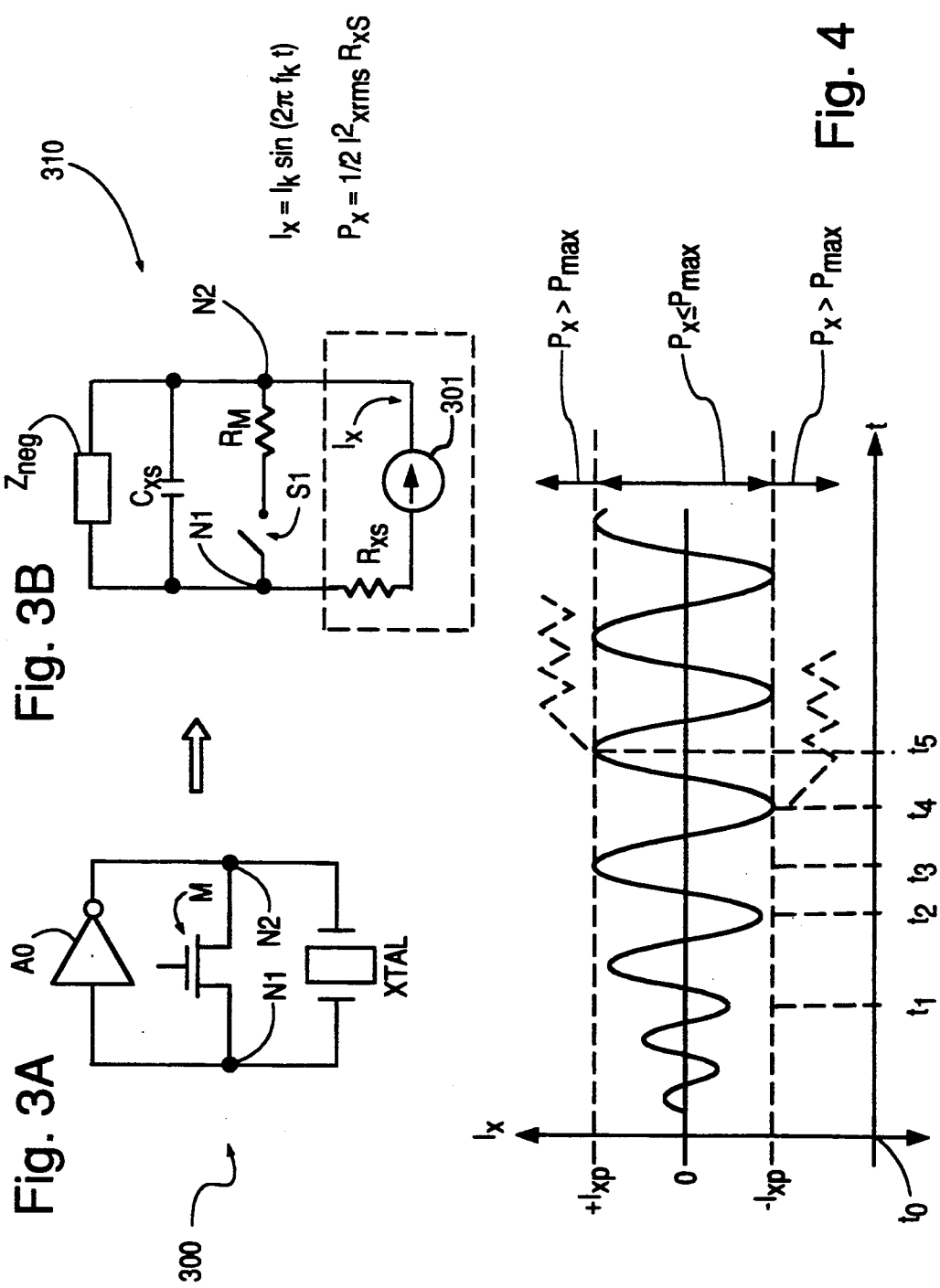

INTEGRATED CRYSTAL OSCILLATOR WITH CIRCUIT FOR LIMITING CRYSTAL POWER DISSIPATION

FIELD OF THE INVENTION

The present invention is generally related to crystal-controlled oscillators and more specifically to high frequency crystal-controlled oscillators contained in an integrated circuit.

BACKGROUND OF THE INVENTION

Crystal-controlled oscillators typically include a crystal and an amplifier circuit. The characteristics of crystal-controlled oscillators are dependent on the amplification properties of the amplifier circuit. Unfortunately, the amplification properties of the amplification circuit vary from one integrated circuit to the next. In mass production situations, uniform oscillator operation over a series of mass-produced integrated circuits is difficult to obtain.

In addition, high frequency piezoelectric crystals have a characteristic motional resistance $R_{XS}$ which varies from as low as about 10 ohms to as high as about 50 ohms from one crystal to the next. Each piezoelectric crystal has a manufacturer-specified, maximum power dissipation level $P_{MAX}$. If a crystal oscillates too wildly and maximum power level $P_{MAX}$ is exceeded, thermo-mechanical mechanisms within the crystal can overtake the basic oscillatory mechanisms and cause the crystal to stray from its fundamental frequencies, or worse yet, cause permanent damage to the crystal. Higher resistance crystals dissipate more power for a given root-mean-square (rms) oscillation current than lower resistance crystals. If the amplifier circuit in the crystal-controlled oscillator does not include limiting circuitry, oscillations may grow large enough to exceed maximum power dissipation level $P_{MAX}$. There is no practical method for determining whether limiting circuitry is required during integrated circuit production.

SUMMARY OF THE INVENTION

A self-stabilizing high frequency crystal oscillator in an integrated circuit is provided according to the principles of this invention, with self-regulating means for taming the oscillatory behavior of overly-active amplifiers so that they operate in a substantially similar manner to other, less-active amplifiers. In one embodiment of the invention, a variable resistor is connected parallel to the crystal and the resistance of the variable resistor is adjusted to maintain the magnitude of oscillations within the predefined safe power range.

Preferably, the self-stabilizing high frequency crystal oscillator includes a Pierce design crystal-controlled oscillator coupled to a self-stabilizing circuit. The self-stabilizing circuit includes a power detection means that enables a power limiting means when the dissipated power level of the crystal reaches a predetermined level. When the power limiting means is enabled, the power limiting means drains power from the crystal so that the maximum power dissipation level for the crystal is not reached.

BRIEF DESCRIPTION OF THE DRAWINGS

FIGS. 3A and 3B illustrate circuits for explaining the principles of this invention.

FIG. 4 is a waveform plot explaining the operation of the oscillator shown in FIG. 2.

DETAILED DESCRIPTION OF THE INVENTION

Figure 1:
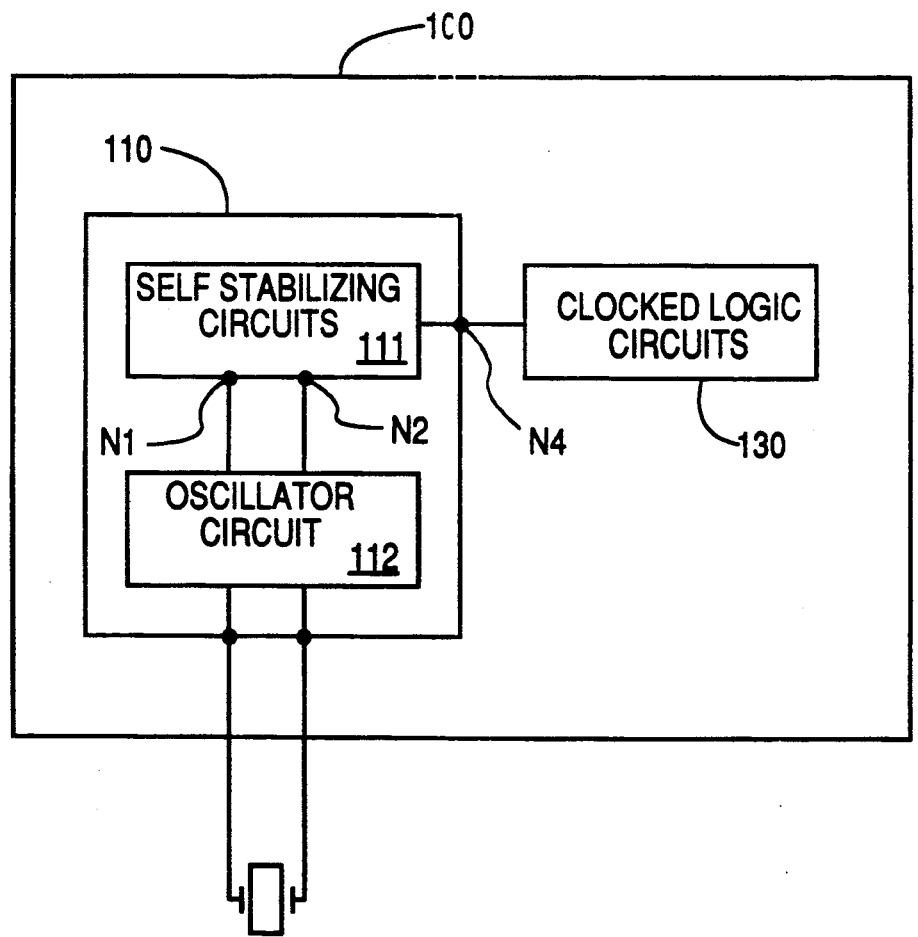
FIG. 1 is a block diagram of the self-stabilizing high frequency crystal oscillator of this invention.

According to the principles of this invention, a Pierce design self-stabilizing high frequency crystal oscillator 110 (FIG. 1) is included in an integrated circuit 100. Oscillator 110 is operable over a range of about 10 MHz to about 50 MHz, preferably about 20 MHz. The clock signal from circuit 110 at node N4 drives clocked logic circuits 130 which are also included in integrated circuit 100. In this embodiment, self-stabilizing high frequency crystal oscillator 110 includes a Pierce design crystal-controlled oscillator 112 coupled to self-stabilizing circuit 111.

Self-stabilizing circuit 111 detects the oscillation amplitudes at nodes N1 and N2 of crystal-controlled oscillator 112. Self-stabilizing circuit 111 prevents the oscillations from exceeding a predetermined maximum power dissipation level for crystal XTAL. Thus, self-stabilizing circuit 111 includes means for detecting oscillation amplitudes and means for limiting the gain of crystal-controlled oscillator circuit 112. Accordingly, independent of manufacturing tolerances from integrated circuit to integrated circuit, self-stabilizing circuit 111 assures that the maximum power dissipation level $P_{MAX}$ of crystal XTAL is not exceeded.

For example, as illustrated in FIG. 4, a current trace for oscillator 110 has a maximum amplitude that is bounded by predetermined current level $\pm I_{xp}$. However, with time, the oscillations increase and approach predetermined current level $\pm I_{xp}$, which corresponds to a safe predetermined power level $P_x$. The power detecting means of self-stabilizing circuit 111 detects this increase in amplitude. The power detecting means enables the limiting means of circuit 111 which in turn automatically drains power from crystal-controlled oscillator circuit 112 so that at equilibrium, just enough power is provided to sustain the oscillations such that the power dissipation does not exceed the predetermined safe level power $P_x$. Thus, according to the principles of this invention, a method for self-regulating an oscillator circuit in an integrated circuit is provided so that the output power is maintained below a predetermined power limit $P_x$.

Figure 2:
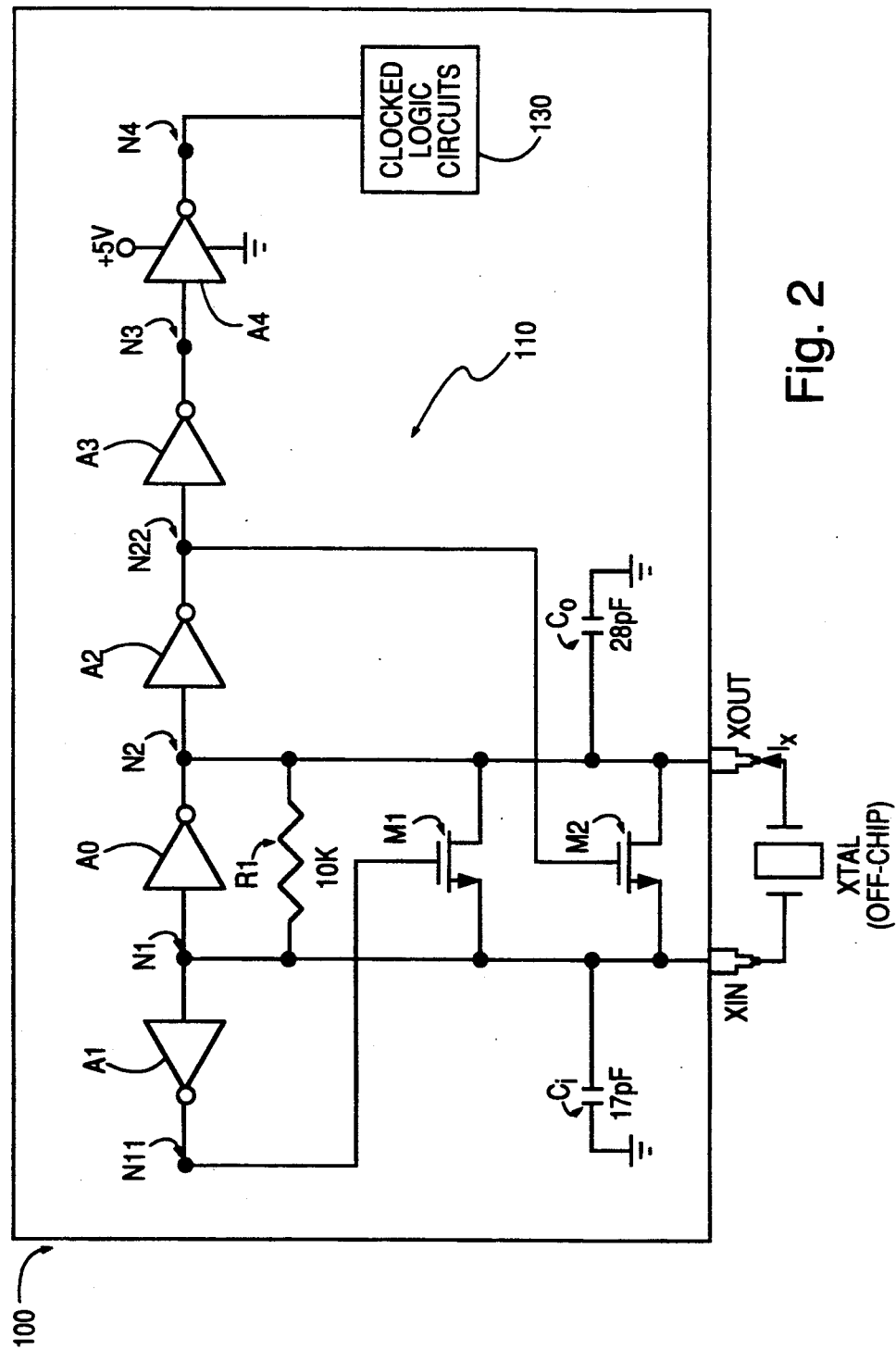
FIG. 2 is a schematic diagram of a first self-limiting crystal oscillator in accordance with the invention.

One embodiment of self-stabilizing high frequency crystal oscillator 110 of this invention is illustrated in more detail in FIG. 2. The pierce design oscillator circuit includes amplifier $A_0$, as well as capacitors $C_i$, $C_o$, bias resistor R1, and crystal XTAL, which is external to integrated circuit 100. Self-regulating circuit 111 (FIG. 1) includes amplifiers $A_1$ and $A_2$ (FIG. 2) and transistors $M_1$ and $M_2$, where amplifiers $A_1$ and $A_2$ comprise the power detection means and transistors $M_1$ and $M_2$ comprise the power limiting means. Self-regulating circuit 111 detects the oscillation amplitudes of piezoelectric crystal XTAL at nodes $N_1$ and $N_2$, and drains power from oscillation amplifier $A_0$ to prevent the oscillations from growing beyond a predetermined, maximum power dissipation level $P_{MAX}$ specified for crystal XTAL.

The positive and neqative oscillation amplitudes are detected by CMOS (Complementary Metal Oxide Semiconductor) inverters $A_1$ and $A_2$. When the oscillations grow beyond a predetermined level such that power level $P_x$ is about to be exceeded, amplifiers (inverters) $A_1$ and $A_2$ turn on n-channel MOS transistors M1 and M2 thereby shorting out crystal XTAL for part of its oscillatory waveform. Equilibrium is reached when the power provided by oscillation amplifier $A_0$ equals the power drain of shorting transistors M1 and M2 plus the power drain of crystal XTAL. At equilibrium, just enough power is provided to sustain the oscillations such that the power dissipation does not exceed predetermined safe power level $P_x$.

When DC power (+5V) is first applied to circuit 110 and oscillations start, transistors M1 and M2 are biased off. At equilibrium, the waveform at terminal XOUT is not large enough for 5 volt CMOS logic use. Therefore, amplifiers A2, A3 and A4, which are pulse shapers in this embodiment, square up the waves present at node $N_2$. Oscillator circuit 110 preferably delivers about 30% duty cycle in the worst case. Provisions for 50% duty cycle may be added if desired, e.g., a toggle type flip-flop or AC coupling. Circuit 110 of this invention provides a low cost self-regulating oscillator circuit.

Crystal XTAL (FIG. 2) can have a series resistance as low as 10 ohms. Stray capacitance $C_{XS}$ of crystal XTAL plus amplifier $A_0$ is typically 11 picofarads or less. The Q is preferably 20,000 or greater. Capacitors, $C_i$, preferably about 17pF, and $C_0$, preferably about 28pF, are provided respectively at terminals XIN and XOUT together with a bias resistance $R_1$, preferably with a resistance of greater than 10KΩ for initializing oscillations.

Amplifiers A0-A4 are standard CMOS inverters. Each amplifier comprises a p-channel field effect transistor having a source connected to a +5 volt rail and an n-channel field effect transistor having a source connected to a ground voltage rail. An input line of each inverter connects the gates of the p-channel and n-channel transistors while the output line of each inverter connects the drains of these transistors.

Limiting transistors, M1 and M2, are fabricated with the same process which produces the n-channel transistors of CMOS inverters A0-A4. The channel widths of transistors, M1 and M2, a re empirically adjusted using, for example, a SPICE type of computer simulation of the circuit, until their resistance is sufficient to maintain oscillations within a predefined safe range as explained directly below. In one embodiment, the channel widths of transistors M1 and M2 were about 100 microns. Typically, the channel widths are in the range of about 50 microns to about 200 microns.

FIG. 3A shows a basic circuit 300 for a self-regulating circuit according to the principles of this invention that maintains the power output of oscillation amplifier $A_0$ within a predetermined range. FIG. 3B is an equivalent circuit 310 for basic circuit 300 (FIG. 3A). Oscillation amplifier $A_0$ is represented as a negative resistance $Z_{NEG}$. Capacitor $C_{XS}$ is the equivalent parallel input capacitance of oscillation amplifier $A_0$ plus the crystal. Crystal resonant circuit XTAL is represented by the series combination of motional resistance $R_{XS}$, and an oscillatory current source 301. Transistor M, which represents transistors M1, M2 and amplifiers A1 and A2 (FIG. 2), is represented as a switch S1 in series with positive resistance $R_M$. Switch S2 and resistance $R_M$ are in parallel with negative resistance $Z_{NEG}$, $C_{XS}$, and crystal resonant circuit XTAL. Prior to considering the operation of equivalent circuit 310, the oscillator current $I_X$ of oscillatory current source 301 and the power dissipated by crystal resonant circuit XTAL are defined.

Oscillation current $I_x$ produced by oscillatory current source 301 is:

$$I_x = I_k \sin(2\pi f_k t)$$

where $f_k$ is the fundamental frequency, and $I_k$ is the current amplitude. The real power dissipated by the crystal during oscillations is:

$$P_x = \tfrac{1}{2} I^2_{XRMS} {}^2 R_{XS}$$

where $I_{XRMS}$ is the root mean square value of the oscillation current $I_X$.

FIG. 4 is a current versus time waveform plot for equivalent circuit 310. From a power-off state, oscillations build up to a predetermined peak amplitude, $+I_{xp}$ to $-I_{xp}$, where this amplitude range maintains the power $P_X$ at or below a predetermined maximum power dissipation level $P_{MAX}$. Typically, maximum power dissipation $P_{MAX}$ is no more than half a milliwatt. Equilibrium current $I_{XRMS}$ is preferably maintained below approximately 4 milliamps (RMS) when the maximum crystal resistance $R_{XS}$ is about 50 ohms.

When power is applied at time, $t_0$, the absolute value of negative resistance $Z_{NEG}$ should be greater than the motional resistance $R_{XS}$ so that oscillations build up. In FIG. 4, the oscillations increase in amplitude at time points, $t_1$, $t_2$, and $t_3$ and are within a current range for safe power level $P_X$. If the absolute value of negative resistance $Z_{NEG}$ remains greater than motional resistance $R_{XS}$ at time $t_4$, the amplitude of oscillations exceed the current range as illustrated by the broken line. This characteristic was induced by manufacturing tolerances in prior art integrated circuit crystal-controlled oscillators. In contrast, according to the principles of this invention, at time $t_4$, oscillation damping transistor M becomes sufficiently conductive, i.e., switch S1 closes and positive resistance $R_M$ is connected in parallel with negative resistance $Z_{NEG}$ and motional resistance $R_{XS}$. Resistance $R_M$, i.e., the channel width of transistor M, is selected such that the total real impedance of the combination of negative resistance $Z_{NEG}$ and resistor $R_M$ is negative, preferably close to the negative value of motional resistance $R_{XS}$. The addition of resistance $R_M$ keeps the oscillations within the safe current range where $P_X \leq P_{max}$ while at the same time not overly-damping the oscillations.

Figure 5:
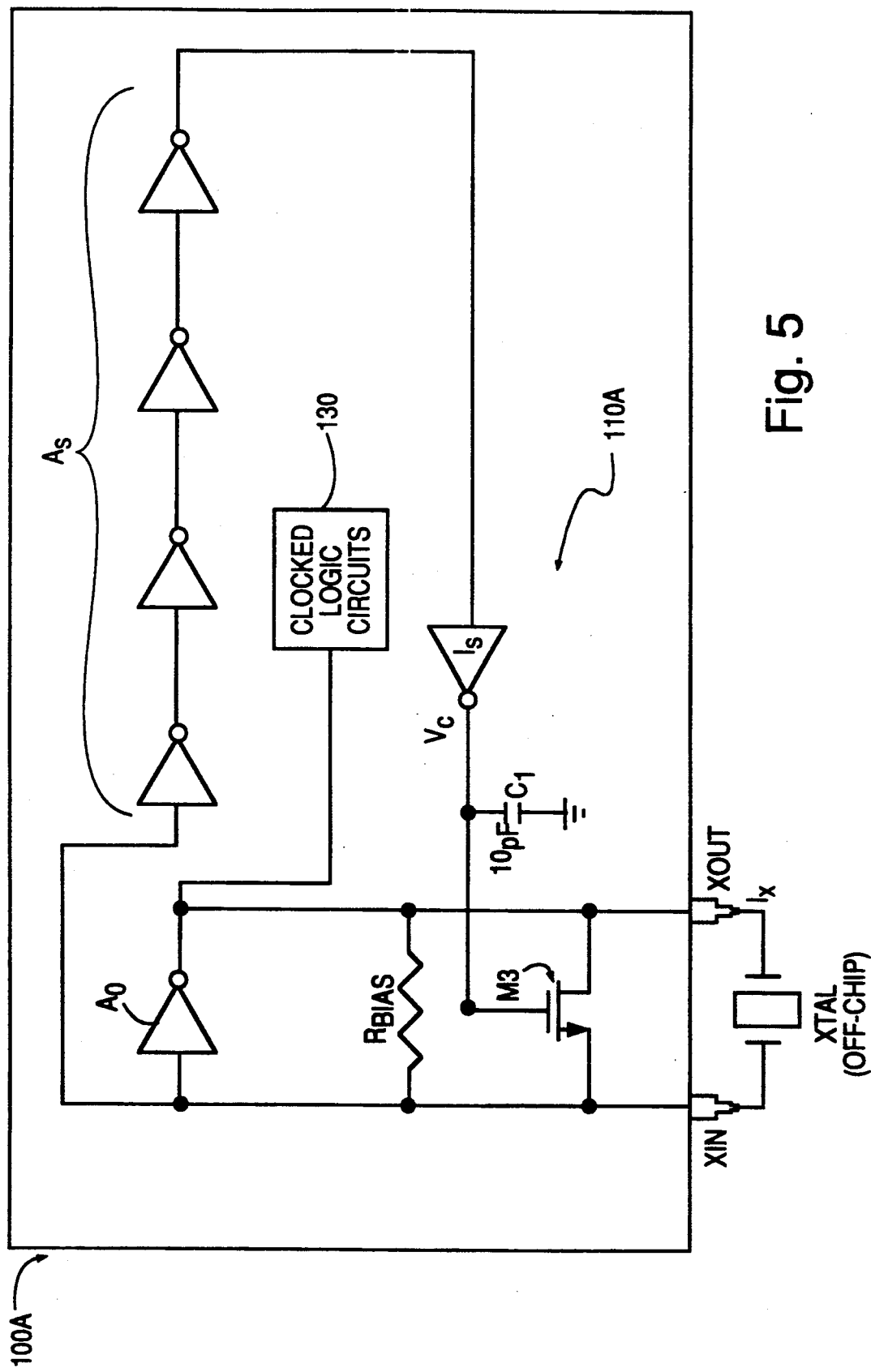
FIG. 5 is a schematic diagram of another self-limiting oscillator according to the invention wherein the oscillation damping means is placed in parallel within the oscillator loop and the control voltage $V_C$ is almost a constant.

FIG. 5 is a schematic diagram of another embodiment of a self-stabilizing oscillator circuit 110A contained in an integrated circuit 100A according to the principles of the invention. Oscillator voltage $V_{IN}$ is detected by level detector $A_S$. Level detector $A_S$ and high resistance inverter $I_S$, on the order of 200 KΩ, convert voltage $V_{IN}$ into an average value developed across integrating capacitor $C_I$ to adjust the bias voltage to the gate of field effect transistor $M_3$ thereby maintaining oscillations within a predetermined safe power range, in a manner similar to that described above.

Many embodiments other than those described above will become apparent to those skilled in the art in view of the present disclosure. The present invention contemplates placing damping resistors in series with the crystal as well as shunting them parallel to the crystal. Bipolar transistors may be used in place of field effect transistors, and conductivity types may be appropriately switched from n-channel to p-channel within the circuits. Accordingly, the scope of the present application should not be limited to the examples described above but rather should be defined in view of the following claims.

What is claimed is:

1. In an integrated circuit containing a crystal-controlled oscillator circuit, a circuit comprising:
   amplifier means, operatively coupled to said oscillator circuit, for detecting power dissipated by an oscillator crystal wherein said amplifier means includes an input line and an output line with said input line being connected to said crystal-controlled oscillator circuit; and
   means, responsive to the amplifier power detection means, for limiting power dissipation of said oscillator crystal to a predetermined safe limit wherein upon said power dissipation reaching a predetermined level, said amplifier power detection means enables said power limiting means to drain power from said crystal-controlled oscillator circuit.

2. The circuit of claim 1, wherein said crystal-controlled oscillator circuit further comprises two input terminals for connecting said oscillator crystal to said crystal-controlled oscillator circuit.

3. The circuit of claim 1 wherein said power limiting means comprises a field effect transistor having a source, a drain and a gate wherein said source is connected to a first of said two terminals, said drain is connected to a second of said two terminals, said gate is connected to said amplifier means output line whereby upon said power reaching said predetermined level, said field effect transistor drains power and thereby maintains said oscillator power within said predetermined level.

4. The circuit of claim 3 wherein said amplifier means further comprises a second input line, which is different from said first-mentioned amplifier means input line, and a second output line, which is different from said first-mentioned amplifier means output line, with said second input line being connected to said crystal-controlled oscillator circuit.

5. The circuit of claim 4 wherein said power limiting means further comprises a second field effect transistor, different from said first-mention field effect transistor, having a source, a drain and a gate wherein said source is connected to said first of said two terminals, said drain is connected to said second of said two terminals, said gate is connected to said amplifier means second output line whereby upon said power reaching said predetermined level, said second field effect transistor drains power and thereby maintains said oscillator power within said predetermined level.

6. The circuit of claim 4 wherein said amplifier means comprises an inverter having an output line and output line and further wherein said amplifier means first input line is said inverter input line and said amplifier means first output line is said inverter output line.

7. The circuit of claim 6 wherein said amplifier means comprises a second inverter, which is different from said first-mentioned inverter, having an input line and output line and further wherein said amplifier means second input line is said second inverter input line and said amplifier means second output line is said second inverter output line.

8. The circuit of claim 1 further comprising means, operatively coupled to said amplifier means, for wave shaping an input signal wherein said wave shaping means is connected to the output line of said amplifier means so that the output signal of said amplifier means is said input signal.

9. The circuit of claim 8 wherein said wave shaping means comprises a plurality of inverters.

10. The circuit of claim 1 wherein said crystal-controlled oscillator circuit is a Pierce oscillator circuit.

11. An integrated circuit crystal-controlled oscillator for use with an oscillator crystal, the oscillator comprising:
    first amplifier means, operatively coupled to said oscillator crystal, for building and sustaining oscillations in the crystal;
    second amplifier means having an input line coupled to the first amplifier means and an output terminal; and
    an oscillation damping transistor having source and drain terminals operatively coupled to said oscillator crystal and a gate terminal connected to the output terminal of the second amplifier means wherein upon the power dissipated by said oscillator crystal reaching a predetermined level, said second amplifier turns on said transistor and said transistor dampens the output of said oscillator crystal thereby maintaining said crystal power dissipation at or below said predetermined level.

12. In an integrated circuit, a circuit comprising:
    a crystal-controlled oscillator circuit having first and second input terminals for connecting an oscillator crystal to said crystal-controlled oscillator circuit;
    level detection means comprising a plurality of inverters connected in series with an input line connected to said crystal-controlled oscillator circuit and an output line; and
    means, responsive to the level detection means, for limiting power dissipation of said oscillator crystal to a predetermined safe limit wherein upon said power dissipation reaching a predetermined level, said level detection means enables said power limiting means to drain power from said oscillator circuit.

13. The integrated circuit of claim 12 wherein said power limiting means comprises a field effect transistor having a source, a drain and a gate wherein said source is connected to said first input terminal, said drain is connected to said second input terminal, said gate is coupled to said level detection means output line whereby upon said power reaching said predetermined level, said field effect transistor drains power and thereby maintains said oscillator power within said predetermined level.

14. The integrated circuit of claim 13 wherein said power limiting means further comprises an integrating means having an input line and an output line wherein said integrating means input line is connected to the output line of said level detection means and said integrating means output line is connected to said gate thereby coupling said gate to said level detection means.

15. The integrated circuit of claim 14 wherein said integrating means comprises an inverter and a capacitor.

16. The integrated circuit of claim 12 wherein said crystal-controlled oscillator circuit comprises a Pierce oscillator circuit.

17. A compensation method for performance variability of a crystal-controlled oscillator circuit in an integrated circuit introduced by manufacturing tolerances comprising the steps of:

using an amplifier means, operatively coupled to said oscillator circuit, for detecting power dissipated by an oscillator crystal; and limiting power dissipation of said oscillator crystal to a predetermined safe limit wherein upon said power dissipation reaching a predetermined level, the amplifier power detecting means enables a power limiting means to drain power from said oscillator circuit thereby compensating for performance variability of the crystal-controlled oscillator circuit.

* * * * *